United States Patent [19]
Rohde

[11] Patent Number: 5,422,554
[45] Date of Patent: Jun. 6, 1995

[54] VACUUM NOZZLE CAPABLE OF ADJUSTABLE PLACING FORCE

[75] Inventor: Terry L. Rohde, Coral Springs, Fla.

[73] Assignee: Motorola, Inc., Schaumburg, Ill.

[21] Appl. No.: 26,795

[22] Filed: Mar. 5, 1993

[51] Int. Cl.⁶ .................................... B65H 11/02
[52] U.S. Cl. ...................... 318/568.21; 318/568.1; 414/627; 414/752; 29/429; 901/39
[58] Field of Search .................. 318/560–646; 901/1, 3, 5, 7, 9, 12, 13, 15–23; 29/39, 40, 568; 427/8, 425; 118/669–697, 704, 319, 500; 414/225, 751, 758, 773; 346/140 R; 239/434, 600; 51/439; 483/7

[56] References Cited

U.S. PATENT DOCUMENTS

| | | | |
|---|---|---|---|
| 4,615,101 | 10/1986 | Edwards et al. | 29/568 |
| 4,657,470 | 4/1987 | Clarke et al. | 414/627 |
| 4,725,327 | 2/1988 | Matuda et al. | 156/351 |
| 4,806,070 | 2/1989 | Poux et al. | 414/752 |
| 4,888,082 | 12/1989 | Fetcenko et al. | 156/500 |
| 5,064,234 | 11/1991 | Marozsan et al. | |
| 5,104,621 | 4/1992 | Pfost et al. | 422/67 |
| 5,108,703 | 4/1992 | Pfost et al. | 422/65 |
| 5,180,248 | 1/1993 | Marozsan et al. | |
| 5,249,356 | 10/1993 | Okuda et al. | 29/833 |
| 5,308,132 | 5/1994 | Kirby et al. | 294/64.1 |

OTHER PUBLICATIONS

Veeder-Root Digital Products, 7483, 7484, 7485, Ultra-Precision Switches, 1 sheet.
HSI Linear Actuators, 2 sheets.
Omega 1987 Complete Pressure, Strain, and Force Measurement Handbook, by Omega, ©1986, Miniature Tension And Compression Load Cell, p. F-17.
Lord Industrial Automation F/T Series product brochure, by Lord, 1987, Precision Force/Torque Sensing System.

Primary Examiner—Paul Ip
Attorney, Agent, or Firm—Pablo Meles; John H. Moore

[57] ABSTRACT

An apparatus and a method therefor for automated and/or robotic assembly, the apparatus including a vacuum nozzle (201) capable of aspirating and securing a component (202, 204). A spring (312) mechanically coupled to the vacuum nozzle (201) provides a compression force thereto in a direction of a placing operation (214, 216). A controllable actuator (108, 314) is mechanically coupled to the spring (312) for adjusting the compression force that the spring (312) can apply to the vacuum nozzle (201) for adjusting a placing force that is applied to the component (202, 204) in the direction of the placing operation (214, 216).

9 Claims, 4 Drawing Sheets

FIG.5

VACUUM NOZZLE CAPABLE OF ADJUSTABLE PLACING FORCE

CROSS-REFERENCE TO OTHER RELATED APPLICATION

Application No. 07/899,697 filed June 17, 1992 by Schumacher et al., entitled "Fiber Optic Illuminated Nozzle for Backlighting Components".

Application No. 07/956,198 filed Oct. 5, 1992 by Kirby et al., entitled "Circuit Assembly Device for Programably Controlling Placement Force and Method Thereto".

FIELD OF THE INVENTION

This invention relates in general to the field of automated and/or robotic assembly devices, and more specifically to those devices comprising vacuum nozzles capable of placing assembly components.

BACKGROUND OF THE INVENTION

Automated assembly equipment, including robotic assembly equipment, commonly picks and places assembly components using some form of end effector coupled to a movable supporting structure such as a robotic arm. When picking and placing the assembly component using a vacuum nozzle as an end effector, typically a conventional vacuum sensor detects a change in air pressure at the vacuum nozzle that indicates the presence of the assembly component. The assembly component is then placed at the desired location. For example, an integrated circuit component (an IC) is placed on a circuit supporting substrate, e.g., a printed circuit board, in a manufacturing process for assembly in an electronic device. The vacuum nozzle end effector typically applies a predetermined force to the IC component in the direction of the placing operation against the circuit supporting substrate to properly set the IC component on the circuit supporting substrate.

In the case of surface mount IC components, the force pressing the component to the surface of the circuit supporting substrate is necessary to effect contact between each of a plurality of pads and a plurality of pre-soldered contacts, respectively. The plurality of pads and the corresponding plurality of pre-soldered contacts are normally located on opposing surfaces between the IC component and the circuit supporting substrate. Either of the two opposing surfaces can comprise the pads and the other surface the pre-soldered contacts such that when the IC component is placed on the predetermined location on the surface of the circuit supporting substrate the presoldered contacts and the pads are mechanically contacting each other, respectively.

Regrettably, after a placement operation, the assembly component, such as a surface mount IC component, may not be electrically connected to a circuit on the circuit supporting substrate due to improper placement force being applied to the component upon being placed on the circuit supporting substrate. For example, a plurality of pads and pre-soldered contacts require a certain amount of force pressing the two opposing surfaces together to allow all the pre-soldered contacts to settle against the respective pads to effect mechanical and electrical contact therebetween, respectively. This condition can be a significant cause of assembly and manufacturing failures, which is unfortunately detected well after all components are assembled on the circuit supporting substrate. The testing, diagnosing, and repair costs can be significant. Also, the quality of the manufactured product can be severely affected as perceived by the consumer.

Additionally, the end effector is usually required to pick and place different types of assembly components on the circuit supporting substrate during an assembly process. These different assembly components may require different amounts of placing force to be properly placed on the circuit supporting substrate. For example, different surface mount ICs placed on a circuit board will have different numbers of pads assembled to respective presoldered contacts between the ICs and the circuit board. That is, the number of contacts between the different IC components ant the surface of the circuit supporting substrate can vary from placement of a first IC to placement of a second IC. The varying number of contacts between placement operations may require different amounts of placement force to effectively place the different IC components on the circuit supporting substrate for making electrical contact therebetween. Modern mass-manufacturing systems require flexible manufacturing stations that can pick and place different types of components with minimal supervision and with a high placement accuracy. Particularly with surface mount technology, the large volumes of production dictate that an automated or robotic approach be used to maintain competitiveness in the marketplace. The end effector must perform accurate and repeatable placement of components. It also must be flexible from placement operation to placement operation adjusting to different placing requirements.

SUMMARY OF THE INVENTION

In carrying out one form of this invention, there is provided an apparatus and a method therefor for automated assembly, including robotic assembly, the apparatus comprising a vacuum nozzle capable of aspirating and securing a component. A spring is mechanically coupled to the vacuum nozzle for providing a compression force thereto in a direction of a placing operation. A controllable actuator is mechanically coupled to the spring for adjusting the compression force that the spring can apply to the vacuum nozzle for adjusting a placing force that is used to apply to the component in the direction of the placing operation.

DESCRIPTION OF THE PREFERRED EMBODIMENTS

Figure 1:
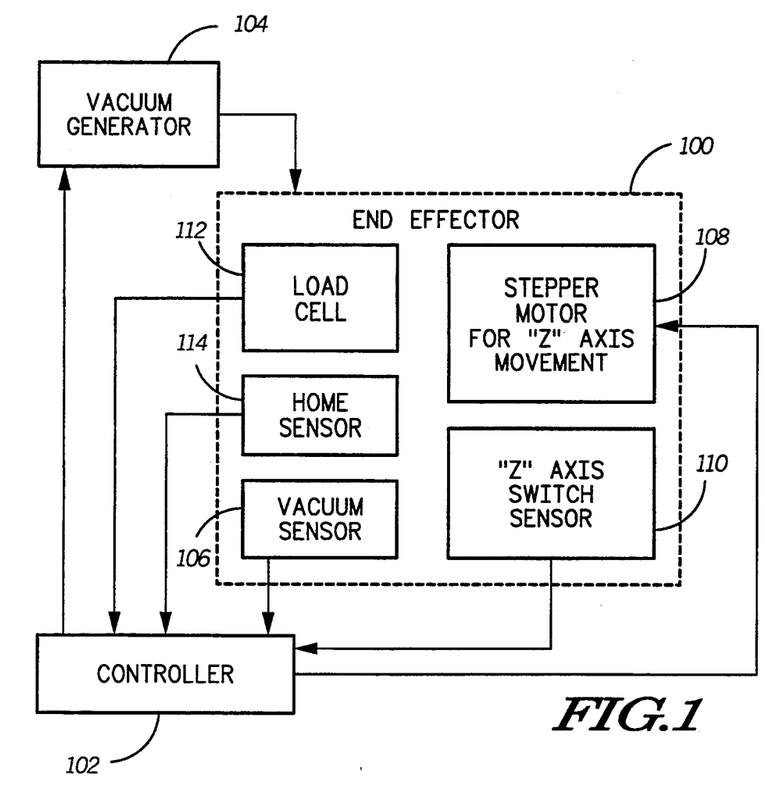
FIG. 1 is a block diagram illustrating a vacuum nozzle end effector in accordance with the preferred embodiment of the present invention.

Referring to FIG. 1, a block diagram illustrates an arrangement of equipment for use in an automated placement process. The automated placement equipment comprises an end effector 100 for picking and placing components, such as in a manufacturing or assembly process. The end effector 100 includes a vacuum nozzle (not shown) which engages a component, for example, an integrated circuit device (IC), by means of a vacuum provided by a controllable vacuum generator 104 which is coupled to the end effector 100. A controller 102 is electrically coupled to the vacuum generator 104 for controlling the vacuum generator 104 to provide a vacuum at the nozzle as necessary to pick and place a component. A vacuum sensor 106 at the end effector 100 can sense the presence of a vacuum at the nozzle to sense when a component has been engaged at the nozzle. The vacuum sensor 106 is electrically coupled to the controller 102 to provide the indication that a component has been captured at the nozzle. Hence, the combination of vacuum nozzle end effector 100, the vacuum generator 104, the vacuum sensor 106, and the controller 102 can be utilized to pick and place components, such as in a manufacturing process.

A decision process at the controller 102 can control the automated placing equipment to move the end effector 100 in position to pick up a component, such as an IC component, from a predetermined location. The end effector 100 can then move to locate the component on a work area, such as a surface of a circuit supporting substrate, for placement thereon.

When the vacuum nozzle is at the predetermined location to pick the component, the controller 102 can activate the vacuum generator 104 to provide a vacuum at the nozzle for engaging the component. Subsequently, when the end effector 100 moves into position to locate the captured component at the desired location on the circuit supporting substrate, the controller 102 can disable the vacuum generator 104 for removing the vacuum from the nozzle and thereby releasing the component at the desired location for placing the component on the desired location. The vacuum sensor 106 provides feedback to the controller 102 for monitoring the engaging and releasing of the component at the vacuum nozzle during the placing operation.

In summary, the vacuum nozzle end effector 100 as discussed above can pick and place components on a circuit supporting substrate, for example, typically utilizing a predetermined placing force for placing a component on the circuit supporting substrate. That is, when the component is located on the surface of the circuit supporting substrate at the desired location the end effector 100 applies a placing force on the component and in the direction of the placing operation to set the component at the location. The end effector 100 presses down the component onto the surface of the circuit supporting substrate with a predetermined force. As long as the end effector 100 continues placing identical components the placing force utilized by the end effector 100 can remain constant from placing operation to placing operation. However, in a flexible manufacturing environment, the automated placing equipment may pick and place different types of components requiring different amounts of placing force for each of the placing operations, as will be more fully discussed below. The end effector 100 includes a linear actuator 108, that is electrically coupled to the controller 102 and can be controlled thereby for providing a loading force on the vacuum nozzle of the end effector 100 for varying a placing force during a placing operation, as will be discussed below. Also, three feedback mechanisms are electrically coupled to the controller 102 for controlling and adjusting the placing force that is applied to a component during a placing operation. First, a precision switch sensor 110 provides a feedback signal to the controller 102 to indicate when the vacuum nozzle is providing the required placing force on the component. Second, the load cell 112 may contain a strain gauge for providing a feedback signal to the controller 102 again for indicating when the vacuum nozzle is applying the required placing force on the component. Finally, a home sensor 114 can be utilized to provide feedback to the controller 102 to indicate when the vacuum nozzle is in an initialized position and ready for a new placing operation. The structure and function of these and other sub-modules in the automated placing equipment are more fully described in the following discussion.

Figure 2:
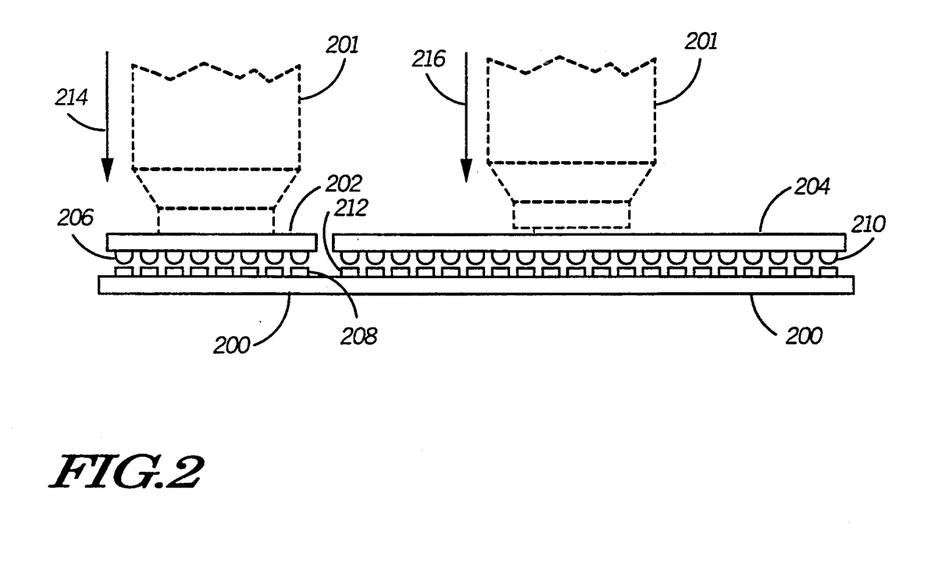
FIG. 2 is a side view of a vacuum nozzle placing components on a circuit supporting substrate according to the preferred embodiment of the present invention.

FIG. 2 illustrates a vacuum nozzle 201 in two placing operations. The vacuum nozzle 201 picks and places a first component 202 and then picks and places a second component 204, where the first placing force 214 is less than the second placing force 216. The different amount of placing force required between the first placing operation and the second operation may be due to the number of pre-soldered interconnections between the respective first and second components (202, 204) and the circuit supporting substrate 200. For example, the first component, such as an IC device 202, may comprise a first number of pre-soldered contacts 206 which correspond to a first number of pads 208 located on the circuit supporting substrate 200. The second component 204, such as a second IC device, may comprise a second number of pre-soldered contacts 210 which correspond to a second number of pads 212 on the circuit supporting substrate 200. The vacuum nozzle 201 may require a greater amount of placing force 216 in the second placing operation as compared to the placing force 214 in the first placing operation because the number of presoldered interconnections is greater in the second component 204 as compared to the first component 202. By applying the greater placing force 216 in the second placing operation the vacuum nozzle 201 presses the component 204 harder down onto the surface of the circuit supporting substrate 200. The additional placing force forces all the pre-soldered contacts 210, or bumps, of the component 204 into contact with the corresponding pads 212 on the circuit supporting substrate 200.

Figure 3:
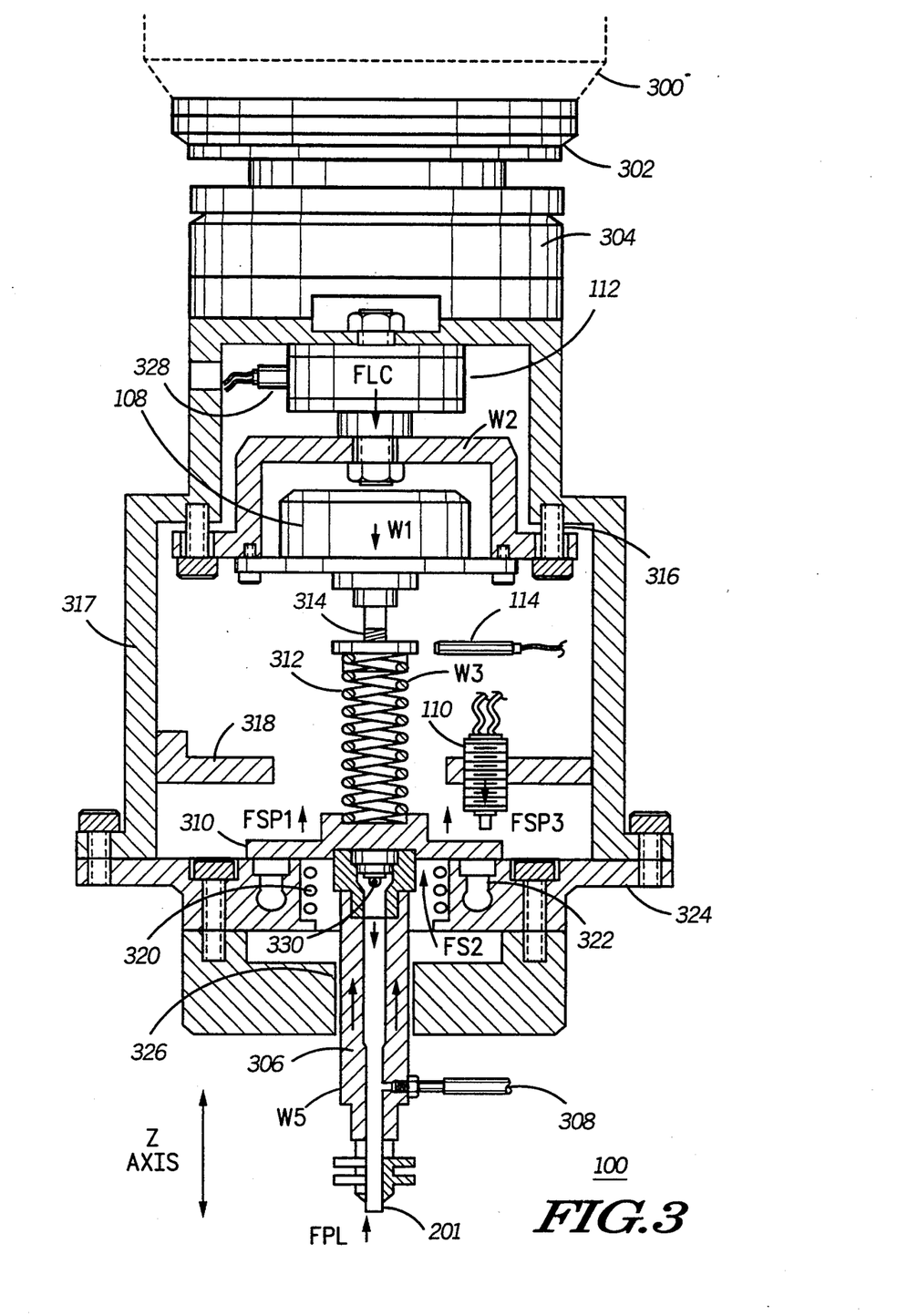
FIG. 3 is a cross-sectional side view of a vacuum nozzle end effector in accordance with the preferred embodiment of the present invention.

FIG. 3 is a cross sectional side view of the vacuum nozzle end effector 100 according to the preferred embodiment of the present invention. A breakaway coupler 302 couples the end effector 100 to a moveable arm 300, such as a robotic arm. Optionally, a tool changing coupler 304 may be included with the end effector 100 to facilitate changing the end effector 100 for another end effector. Hence, the breakaway coupler 302 and the optional tool changer 304 provide means of coupling the end effector 100 to, say, a robotic arm.

The vacuum nozzle 201 is mechanically coupled to a vacuum quill which provides the structural support of the vacuum nozzle 201 and mechanically couples the vacuum nozzle 201 to the end effector 100. The vacuum quill 306 comprises a vacuum channel from the tip of the vacuum nozzle 201 to a vacuum connection 308 which couples to a vacuum generator 104 thereby providing the vacuum at the vacuum nozzle 201.

The vacuum quill 306 is mechanically coupled to a plate 310. The plate 310 is mechanically coupled to one end of a spring 312. The other end of the spring 312 is mechanically coupled to a lead screw 314 which is rotatably coupled to the stepper motor 108. The motor 108 is held to the housing 317 by shoulder screws 316 which allow a very slight Z-axis movement of the stepper motor 108, such as several thousands of an inch (approximately 0.0762 mm), while being held secure to the housing 317. The stepper motor 108 is mechanically coupled to the load cell 112 and the load cell 112 is fixedly coupled to the housing 317. The load cell 112 has a sensor, such as a strain gauge 328, which provides an analog signal representing the amount of force being applied by the load cell 112 to the stepper motor 108. This analog signal can be coupled from the sensor 328 to the controller 102 (see FIG. 1) for monitoring when the load cell 112 is applying force to the stepper motor 108. Typically, the load cell 112 has an operational range of one to four thousands of an inch (0.0254 mm to 0.1016 mm) for monitoring deflection of a cantilevered beam mounted in the load cell 112.

The stepper motor 108 in combination with the lead screw 314 operates as a linear actuator in the Z-axis direction. By incrementally stepping the stepper motor 108 the lead screw 314 advances linearly in the Z-axis direction. As the lead screw 314 advances toward the plate 310 it applies a compression force on the spring 312. As the spring 312 compresses it increases the force against the plate 310. The plate 310 rests on a hard stop 324 that is mechanically coupled to the housing 317 and therefore the compression force of the spring 312 is maintained in the spring 312.

When an assembly component is engaged at the vacuum nozzle 201, such as after a pick operation, the robotic arm 300 then locates the end effector 100 at a work area for placing the assembly component at a desired location, such as on a circuit supporting substrate. When the component at the vacuum nozzle 201 is properly located on the circuit supporting substrate the end effector 100 proceeds in the placing operation by applying a predetermined placing force to the component in the direction of the placing operation. That is, in the Z-axis direction with respect to the end effector 100. The end effector 100, including the housing 317, is lowered by the robotic arm 300 in the Z-axis direction and the vacuum nozzle 201 and quill 306 apply a placing force to the component on the surface of the circuit supporting substrate. As the end effector 100 continues to move down in the Z-axis direction the vacuum quill 306 and the plate 310 begin to retract into the housing 317 of the end effector 100. The plate 310 moves away from the hard stop 324 in the Z-axis direction. The compression force of the spring 312 is applied to the plate 310 which then mechanically couples the compression force to the vacuum quill 306 and the vacuum nozzle 201. This corresponds to a placing force that is then coupled to the component being placed on the circuit supporting substrate. As the housing 317 of the end effector 100 continues to lower in the Z-axis the vacuum quill 306 and plate 310 continue to compress the spring 312. As the spring 312 compresses, it provides increasing compression force against the plate 310. When the spring 312 compresses to a predetermined length the placing force being applied to the component reaches a predetermined value.

For the controller 102 to determine when the placing force has reached the predetermined value the end effector 100 includes a precision switch 110 which is set to the predetermined height in the Z-axis direction relative to the plate 310. As the plate 310 retracts away from the hard stop 324 during the placing operation it eventually contacts the switch 110 which indicates to the controller 102 that the predetermined compression of the spring 312 has been reached. That is, that the predetermined placing force on the component has been obtained. An adjustable stop 318 protects the switch 110 in the event that the plate 310 attempts to travel in the Z-axis direction beyond a safe operating distance. Hence, the Z-axis position of the switch 110 determines the amount of distance traveled by the plate 310 which corresponds to the amount of compression force applied by the compressing spring 312 on the plate 310 before stopping the placing operation.

Alternatively, the controller 102 can monitor the sensor 328 of the load cell 112 for an analog signal output which correlates to the placing force being applied to the component. Typically, the controller 102 may monitor the load cell 112 during an analytical set up to determine the placing force being applied to a component. Once a desired placing force has been determined the end effector 100 preferably utilizes the switch 110 to detect when the placing force has been reached during a placing operation. The precision switch 110 makes the placing operation very repeatable, highly accurate, and fast which is very important in an automated manufacturing environment.

In certain applications the desired placing force to be applied to a component is less than the total weight of the vacuum quill 306, the plate 310, the spring 312, and the stepper motor 108, and other associated weights of the mechanical system. To balance out these weights a second compression spring 320 is included. The second spring 320 applies compression force against the plate 310 which balances out the aforementioned weights to a net zero or as close thereto as desired for a particular operation. This may be accomplished by selecting the second spring 320 to have the required compression characteristics to counter balance the weights.

Additionally, as the placing force becomes very light the vacuum quill 306 may tend to bounce which can make it difficult to pick up components and possibly may drop components while moving the end effector 100 into position for the placing operation. Consequently, a vacuum port 322 can hold down the plate 310 against the hard stop 324 by using vacuum pressure. Preferably, the vacuum hold down of the plate 310 is performed during the picking of a component and while traveling to locate the component on the desired location for the placing operation. When ready to place the component the vacuum can be released from the vacuum port 322 which releases the plate 310 allowing the plate 310 to retract away from the hard stop 324 during the placing operation.

Preferably, a fluid bearing, such as an air bearing 326, is mechanically coupled to the vacuum quill 306 for maintaining an accurate gap between the vacuum quill 306 and the walls of a channel which guide the movement of the vacuum quill 306 in the Z-axis direction. This facilitates the movement of the vacuum quill 306. The use of the air bearing 326 is particularly valuable for very light placing force applications because other mechanical bearing alternatives provide additional weight, or frictional force, or both, to the vacuum quill 306 dynamics. Preferably, the shaft portion of the vacuum quill 306 is rectangularly shaped to keep the vacuum quill 306 from rotating in the channel.

Optionally, a light source 330 is provided in the vacuum quill 306 which can illuminate the component at the vacuum nozzle 201 through an internal shaft in the vacuum quill 306. This lighting of the component may be useful for optical recognition of the component during an automated placing operation.

An additional option is the home sensor 114 which can be utilized to provide feedback to the controller 102 to indicate when the linear actuator 108,314, is in an initialized position. The linear actuator 108,314, can then be controlled from a known starting position for adjusting the compression of the spring 312, such as may be necessary after initialization of the automated placing equipment.

Figure 4:
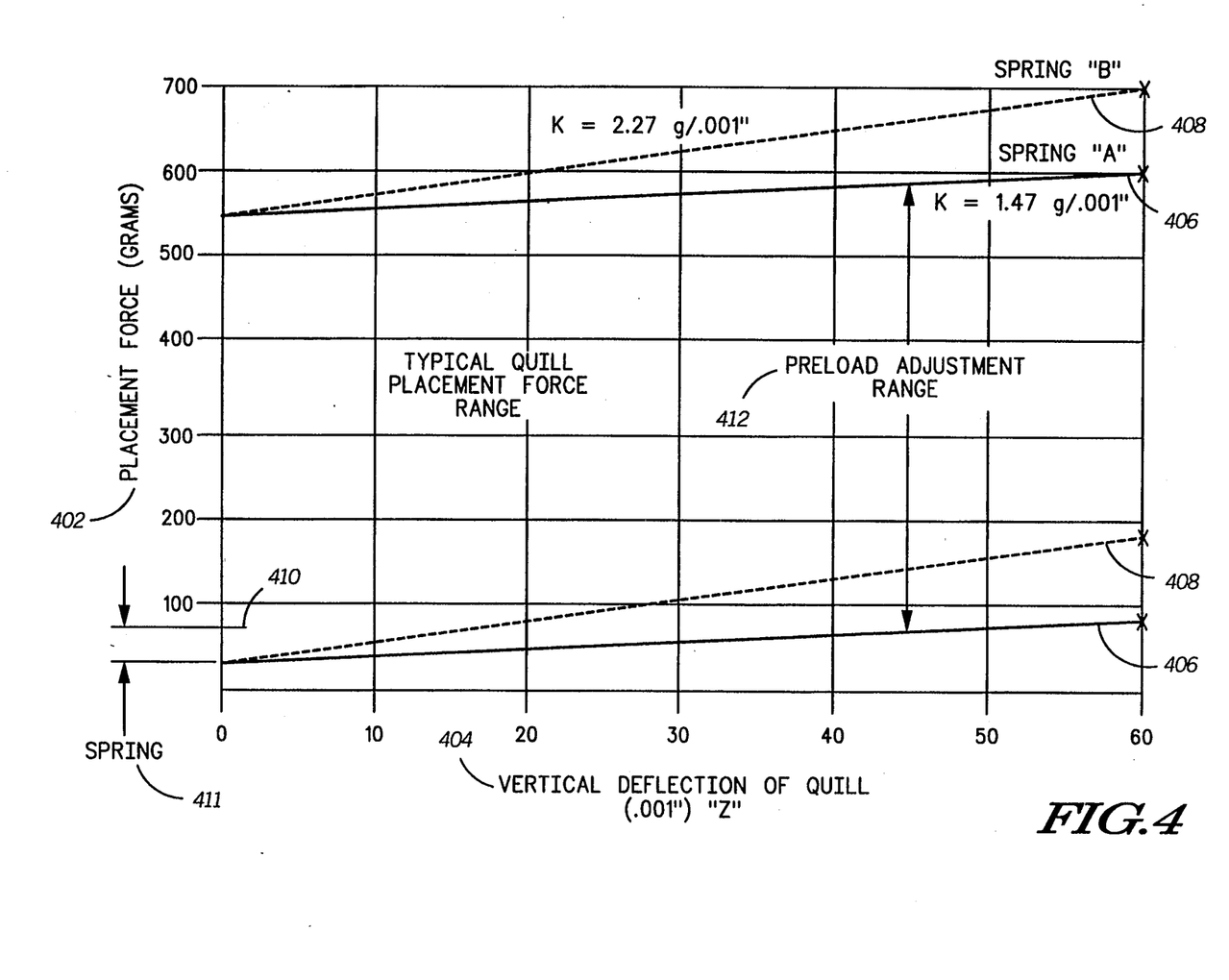
FIG. 4 is a chart of placing force versus Z-axis travel for a vacuum quill of an end effector according to the preferred embodiment of the present invention.

FIG. 4 is a graph of placing force 402 versus vertical deflection for distance traveled by the vacuum quill 306 during a placing operation. Two curves 406, 408, are shown illustrating two substantially linear relationships between placing force 402 and deflection of the vacuum quill 306, where the two curves represent two different springs with different spring constants being used for the spring 312. For example, referring to the first forced deflection curve 406, the vacuum quill weight 410 (including all the weights of the moving quill system) is set at 65 grams. The spring 320 provides a counterbalancing compression force 411 opposing the total quill weights 410. By selecting the appropriate characteristics of the spring 320 the total quill weights 410 can be netted down to zero or as close thereto as desired for a particular application. This allows application of a very light placement force on the component, such as in the range of 10 grams or less.

For each tactile feel curve, the placement force 402 at the zero deflection point of the quill 306 can be set by driving the linear actuator 108, 314, to preload a compression force on the spring 312. Of course, it can also be dependent on the balance between the compression force 411 of the second spring 320 and the total quill weights 410, which is typically a constant for a particular end effector 100.

The slope of a particular tactile feel curve is determined by a spring constant of the particular spring used for spring 312. When the quill 306 and the plate 310 retract away from the hard stop 324, the spring 312 compresses accordingly and applies increasing compression force to the plate 310 as indicated by the slope of the tactile feel curve.

For example, the first tactile feel curve 406 represents a first spring used for spring 312 and the second tactile feel curve 408 represent a second spring used for spring 312. Each separate spring has a different spring constant which is reflected by the different slopes of the curves. The preloading range 412 for the curves 406, 408, is the range where each spring is initially compressed by the linear actuator 108, 314, as discussed above. Therefore, the operating range of the particular placing operation can be controlled by a preloading adjustment of the spring 312 before applying the placing force to the component. This operating range determines the amount of placing force that will be applied to the component at a specific deflection distance of the quill 306. Hence, for example, the deflection curves 406, 408, can operate at a very light placing force with a first preload adjustment. A second set of deflection curves 406', 408', shown represent the first curves having a second preload adjustment thereby operating at a higher placing force range and providing a greater placing force to the component.

In summary, the characteristic of the force deflection curve can be set by: the spring 312 that is used, how much the spring 312 is initially compressed by the linear actuator 108, 314, and by the location of the switch 110 relative to the plate 310 which determines the distance traveled in the Z-axis direction by the plate 310 before the placing operation is stopped.

Figure 5:
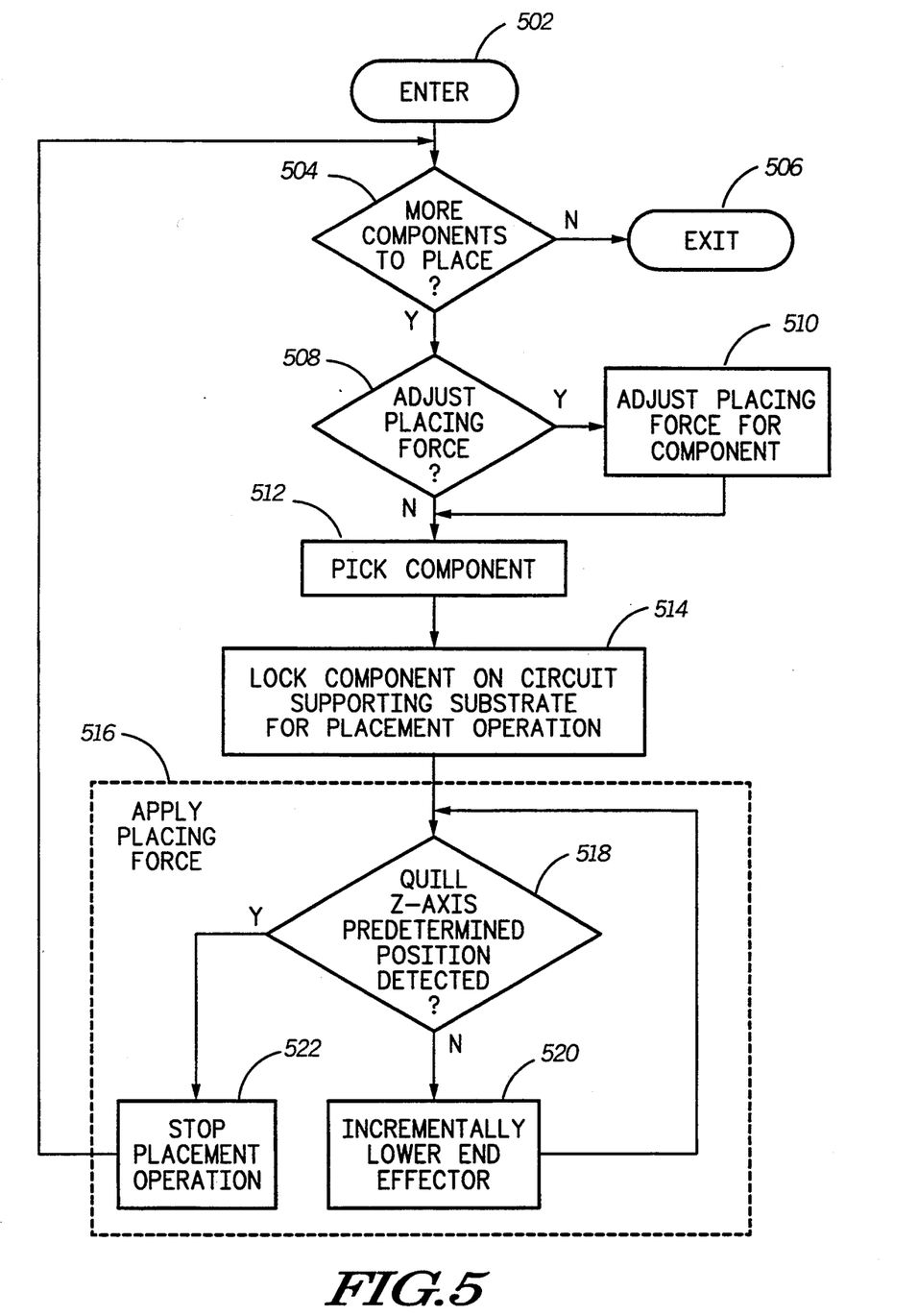
FIG. 5 is a flow diagram illustrating an operational sequence for the controller of FIG. 1 in accordance with the preferred embodiment of the present invention.

FIG. 5 is a flow diagram illustrating an operational sequence for the controller 102 according to the preferred embodiment of the present invention. In a pick and place operation for a flexible automated manufacturing process the controller 102 enters 502 the operational sequence by determining whether there are components to place, at step 504. If there are no components to place the controller 102 exits 506 the pick and place operation, and may perform other functions as may be necessary in a manufacturing process. If the controller 102 determines that a component is to be placed, at step 504, the controller 102 determines whether adjustment of the placing force is necessary for placing the component, at step 508. If adjustment is necessary, the controller 102 adjusts the placing force for the component, at step 510. As discussed earlier, this is accomplished by the controller 102 controlling the linear actuator 108, 314, to set the initial compression of the spring 312 at the desired compression force for placing the component. Alternatively, if the controller 102 determines that the position of the linear actuator 108, 314, is already at the desired compression for the spring 312, at step 508, the controller 102 does not have to further adjust the placing force. The end effector 100 then is moved, such as by a robotic arm, to pick up the component, at step 512. Optionally, the vacuum hold down of the plate 310 by the vacuum port 322 is activated to prevent the vacuum quill 306 from bouncing. After the end effector 100 picks up the component, the end effector 100 is moved to locate the component on the circuit supporting substrate for the placement operation, at step 514. Finally, the end effector 100 moves in the Z-axis to apply the placing force to the component, at step 516.

Within step 516, the controller 102 continuously monitors the Z-axis switch sensor 110 to detect when the vacuum quill 306 and plate 310 have retracted into the housing 317 of the end effector 100 to make contact with the switch 110. If the controller 102 does not detect the switch 110 activated, at step 518, the controller 102 incrementally lowers the end effector 100, at step 520, and continues to monitor the activation of the switch 110, at step 518. On the other hand, when the controller 102 determines that the switch is activated, at step 518, the controller 102 stops the placement operation, at step 522. At this point, the predetermined placing force is being applied to the component on the circuit supporting substrate. After the component is placed with the required placing force, at step 516, the controller 102 may determine whether more components are to be placed, at step 504, and repeat the placing operation.

It is clear by now that the controller 102 can adjust the compression of the spring 312 between the placing of different components thereby providing predetermined placing force for each component as necessary for the particular placing operation. The controller 102 knows the position of the linear actuator 108, 134 and also knows the predetermined placing force that is desired for placing a component. The controller 102 can adjust the compression of the spring 312 by driving the linear actuator 108, 314 to a new position which corresponds to the predetermined compression for the spring 312 for applying a predetermined placing force to the component in the next placing operation. The new compression force of the spring 312 will be applied to the plate 310 and to the vacuum quill 306 when the plate 310 travels back up to the position switch 110. Hence, a new predetermined placing force is applied to the next component during the respective placing operation.

In summary, the placing force of the vacuum nozzle end effector 100 can be adjusted for each individual placing operation as required by the particular component being placed. Further, in an automated manufacturing environment where accuracy, repeatability, and speed are extremely important, the precision switch 110 allows the end effector 100 to quickly and accurately place a component and provide the necessary placing force thereto. Furthermore, the force deflection curve or tactile feel curve can be set for the particular application allowing a wide range of placing force and deflection distance as necessary. For example, the travel distance of the vacuum quill 306 in an exemplary application has been set from 10 thousands of an inch (0.254 mm) up to one quarter of an inch (6.35 mm). Also, in very light placing force applications, the placing force can be adjusted down to, say, 10 grams of force or less. This is due to the balancing spring 320 counter balancing the total weights of the placing elements. Additionally, a vacuum hold down of the vacuum quill 306 and the plate 310 prevents the vacuum quill 306 from bouncing. A bouncing vacuum quill 306 makes it difficult to pick up a component and possibly could drop a component while moving the end effector 100. Optionally, the light source 330 can provide lighting to the vacuum nozzle 201 to assist in optical recognition of components being placed. The vacuum nozzle 201 being capable of adjustable placing force for placing different components, is especially useful for placing surface mount IC components such as used in surface mount technologies including Controlled Collapse Chip Connection (C4), Controlled Collapse Chip Carrier Connection (C5), and Overmolded Pad Array Carrier (OMPAC).

What is claimed:

1. An apparatus capable of automated assembly, comprising:
   a vacuum nozzle capable of aspirating and securing a component;
   a vacuum quill mechanically coupled to the vacuum nozzle, the vacuum quill capable of traveling in a Z-axis:
   a plate mechanically coupled to the vacuum quill;
   a spring mechanically coupled to the vacuum nozzle for providing a compression force thereto in a direction of a placing operation; and
   a controllable actuator mechanically coupled to the spring for adjusting the compression force that the spring can apply to the vacuum nozzle for adjusting a placing force used to apply to a component in the direction of the placing operation.

2. The apparatus of claim 1, further comprising:
   a controller electrically coupled to the controllable actuator for providing a control signal thereto to incrementally adjust a mechanical position of the controllable actuator thereby adjusting the compression force that the spring can apply to the vacuum nozzle for adjusting the placing force used to apply to the component.

3. The apparatus of claim 2, further comprising:
   a movable housing, the controllable actuator being mechanically coupled thereto such that when the housing is moved in the direction of the placing operation the spring compresses in a first direction to provide the compression force to the vacuum nozzle to apply the placing force to the component in the direction of the placing operation.

4. The apparatus of claim 3, further comprising:
   a position sensor electrically coupled to the controller for providing a detection signal thereto for indicating when the compression of the spring in the first direction reaches a predetermined position corresponding to a predetermined compression force being provided to the vacuum nozzle and thereby a predetermined placing force being applied to the component in the direction of the placing operation.

5. The apparatus of claim 3, further comprising:
   a hard stop mechanically coupled to the movable housing;
   a plate interposed between the vacuum nozzle and the spring and mechanically coupled therebetween; and
   a vacuum port located for selectively providing a vacuum hold down force to selectively hold the plate to the hard stop for securing the plate and thus the vacuum nozzle to the movable housing.

6. The apparatus of claim 3, further comprising:
   a hard stop mechanically coupled to the movable housing;
   a plate interposed between the vacuum nozzle and the spring and mechanically coupled therebetween; and
   a counter balancing spring mechanically coupled to the movable housing and oriented for providing a counter balancing compression force to the plate opposing the total weights of the vacuum nozzle, the plate, the spring, and the controllable actuator for providing a placing force to the component that is lighter than the total weights.

7. A method in an automated manufacturing process for placing a component, comprising the steps of:
   aspirating and securing a first component by a vacuum nozzle;
   adjusting a compression force on the vacuum nozzle to a first predetermined value;
   placing the first component at a first predetermined location by moving the vacuum nozzle to the first predetermined location in a placing direction;
   applying a first predetermined placing force to the first component in the placing direction by providing the first predetermined value of the compression force to the vacuum nozzle in the placing direction;
   aspirating and securing a second component by a vacuum nozzle;
   adjusting a compression force on the vacuum nozzle to a second predetermined value:
   placing the second component at a second predetermined location by moving the vacuum nozzle to the second predetermined location in a placing direction; and
   applying a second predetermined placing force to the second component in the placing direction by providing the second predetermined value of the compression force to the vacuum nozzle in the placing direction.

8. The method of claim 7, wherein the applying step for both the first and second components comprises the step of:

increasing the compression force provided to the vacuum nozzle in the placing direction until the compression force reaches the predetermined value to apply the predetermined placing force to the component when the compression force reaches the predetermined value.

9. A robotic end effector, comprising:

a movable housing;

a vacuum nozzle for aspirating and securing a component;

a vacuum quill mechanically coupled to the vacuum nozzle, the vacuum quill capable of traveling in a Z-axis being guided by a channel in the robotic end effector;

an air bearing mechanically coupled to the vacuum quill in the channel for facilitating movement of the vacuum quill in the channel;

a plate mechanically coupled to the vacuum quill;

a hard stop mechanically coupled to the movable housing for setting a first maximum position of travel for the vacuum quill in the Z-axis by stopping the movement of the plate at the first maximum position of travel;

a vacuum port located for selectively providing a vacuum hold down force to selectively hold the plate to the hard stop for securing the plate and thus the vacuum quill to the movable housing at the first maximum position of travel;

a spring having first and second ends oriented for compression in the Z-axis, the first end of the spring being mechanically coupled to the plate;

a controllable linear actuator mechanically coupled to the housing and to the second end of the spring for compressing the spring for providing a compression force of a predetermined value in the Z-axis;

a switch sensor movably coupled to the movable housing for sensing when the plate has moved in the Z-axis to a second maximum position away from the hard stop, the switch sensor providing a position signal indicating when the plate has moved to the second maximum position corresponding to the compression force of the predetermined value being provided to the vacuum quill thereby causing a placing force of a predetermined value to be applied to the component in the Z-axis; and a controller capable of controlling movement of the robotic end effector, the controller being electrically coupled to the switch sensor and to the controllable linear actuator for controlling the controllable linear actuator to compress the spring for providing the compression force of the predetermined value in the Z-axis, and for controlling the movement of the movable housing in the Z-axis for applying a placing force to the component by providing increasing compression force to the vacuum quill as the vacuum quill and plate move toward the second maximum position, and for monitoring the position signal from the switch sensor to determine when to stop the movement of the movable housing when the plate has moved to the second maximum position corresponding to the compression force of the predetermined value being provided to the vacuum quill thereby causing the placing force of the predetermined value to be applied to the component.

* * * * *